US006655638B2

(12) United States Patent
Deel

(10) Patent No.: US 6,655,638 B2
(45) Date of Patent: Dec. 2, 2003

(54) SOLAR ARRAY CONCENTRATOR SYSTEM AND METHOD

(75) Inventor: Gary G. Deel, Littleton, CO (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 10/253,847

(22) Filed: Sep. 23, 2002

(65) Prior Publication Data

US 2003/0057330 A1 Mar. 27, 2003

Related U.S. Application Data

(60) Provisional application No. 60/324,183, filed on Sep. 21, 2001.

(51) Int. Cl.[7] .................................................. B64G 1/44
(52) U.S. Cl. ..................... 244/173; 136/246; 136/245
(58) Field of Search ........................ 244/173, 164, 244/158 R; 136/246, 245

(56) References Cited

U.S. PATENT DOCUMENTS

| 4,282,394 A |   | 8/1981  | Lackey et al. ............ 136/245 |
|-------------|---|---------|-----------------------------------|
| 4,316,448 A |   | 2/1982  | Dodge ...................... 126/424 |
| 6,008,447 A | * | 12/1999 | Meurer et al. ............ 136/245 |
| 6,010,096 A | * | 1/2000  | Baghdasarian ............ 244/173  |
| 6,017,002 A | * | 1/2000  | Burke et al. .............. 244/173 |
| 6,050,526 A | * | 4/2000  | Stribling, Jr. ............. 244/173 |
| 6,051,775 A | * | 4/2000  | Brown et al. ............. 136/245 |
| 6,118,067 A | * | 9/2000  | Lashley et al. ........... 136/245 |
| 6,260,808 B1 | * | 7/2001  | Bodeau et al. ........... 244/173  |

FOREIGN PATENT DOCUMENTS

| DE | 41 10 819 A1  | 9/1991  | .......... B60K/16/00  |
| DE | 197 02 943 A1 | 8/1998  | ......... H01L/31/052 |
| EP | 0 959 001 A1  | 11/1999 | ............ B64G/1/44 |
| EP | 0 977 273 A1  | 2/2000  | ......... H01L/31/045 |

OTHER PUBLICATIONS

PCT International Search Report dated Mar. 26, 2003 for PCT/US02/30168 filed Sep. 23, 2002 (7 pages).

J. T. Renshall and G. W. Marks, *The AstroEdge* Solar Array for the NASA Small Spacecraft Technology Initiative "Clark" Satellite*, Conference Record of the 25th IEEE Photovoltaic Specialists Conference, May 13–17, 1996, pp 271–276.

* cited by examiner

*Primary Examiner*—J. Woodrow Eldred
(74) *Attorney, Agent, or Firm*—Baker Botts L.L.P.

(57) ABSTRACT

A solar array concentrator assembly includes a first solar array panel configured to receive solar energy and a first adjustable concentrator coupled to the first solar array panel. The first adjustable concentrator reflects solar energy toward the first solar array panel. A first drive shaft is coupled to the first adjustable concentrator. The first drive shaft is configured to rotate the first adjustable concentrator relative to the first solar array panel to maximize the solar energy reflected toward the first solar array panel.

16 Claims, 3 Drawing Sheets

SOLAR ARRAY CONCENTRATOR SYSTEM AND METHOD

RELATED APPLICATION

This application claims the benefit of U.S. Provisional Application Ser. No. 60/324,183, filed Sep. 21, 2001, entitled Solar Array Concentrator.

TECHNICAL FIELD OF THE INVENTION

This invention relates to a solar array concentrator system and method, and more particularly to a solar array having adjustable concentrators for varying the relative angle between a solar array panel and the concentrator.

BACKGROUND OF THE INVENTION

Solar arrays convert sunlight into electricity. Such conversion results in an economical power source for many applications, such as spacecraft. In general, the more sunlight received by a solar array, the more power. Solar arrays operate most effectively when receiving a maximum of available solar energy. However, the position of the solar array with reference to incoming solar energy does not always enable the array to receive maximum energy. Some systems presently in use position the solar array to enable the array to receive maximum solar energy. These systems are heavy and utilize somewhat complicated mechanisms. When a solar array is used in an application where weight is an important factor, the mechanism for adjusting the solar array becomes an unacceptable portion of the total weight of the assembly.

Concentrators, or reflectors, may be added to solar arrays in order to focus sunlight on the arrays, thus providing more power output from the arrays. However, fixed concentrators tend to shadow the array at certain angles and may cause overheating of substrates. The fixed concentrator on a solar array driven by a solar array drive is one efficient method of producing power. However, one disadvantage with a fixed concentrator on a driven solar array is the high cost of building solar array drives and the mechanisms needed to track sun and command the drives.

SUMMARY OF THE INVENTION

The present invention provides a solar array concentrator system and method that substantially eliminates or reduces at least some of the disadvantages and problems associated with previous systems and methods.

In accordance with a particular embodiment of the present invention, a solar array concentrator assembly includes a first solar array panel configured to receive solar energy and a first adjustable concentrator coupled to the first solar array panel. The first adjustable concentrator reflects solar energy toward the first solar array panel. A first drive shaft is coupled to the first adjustable concentrator. The first drive shaft is configured to rotate the first adjustable concentrator relative to the first solar array panel to maximize the solar energy reflected toward the first solar array panel.

The solar array concentrator assembly may include a positioning motor coupled to the first drive shaft, the positioning motor adjusting the position of the first concentrator relative to the first solar array panel to maximize the amount of solar energy reflected toward the first solar energy panel. The assembly may further include a second solar array panel configured to receive solar energy, wherein the second solar array panel is foldably coupled to the first solar array panel. A second adjustable concentrator may be coupled to the second solar array panel, the second adjustable concentrator reflecting solar energy toward the second solar array panel. A second drive shaft may be coupled to the adjustable concentrator, wherein the second drive shaft is configured to rotate the second adjustable concentrator relative to the second solar array panel to maximize the solar energy reflected toward the second solar array panel. A draw mechanism may be coupled to the first and second drives, wherein the draw mechanism is configured to engage the first drive shaft with the second drive shaft to form a continuous drive shaft and hinge between the first and second solar array panels.

Technical advantages of particular embodiments of the present invention include an adjustable concentrator hinged to a solar array panel to vary the relative angle between the concentrator and the solar array panel. Thus, more energy is provided onto the panel than would be available without the concentrator. A further technical advantage of the present invention is the elimination of a mechanism coupled to the solar array to position the array to receive more energy. Such mechanisms for the solar array panels tend to be costly and complicated drives. The adjustable concentrator of the present invention provides a lighter weight and less costly assembly than assemblies used to drive the solar arrays thereby making the adjustable concentrators of the present invention a logical choice for applications such as a spacecraft or other vehicle where weight is a factor and where maneuverability is important.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which.

DETAILED DESCRIPTION OF THE INVENTION

Figure 1:
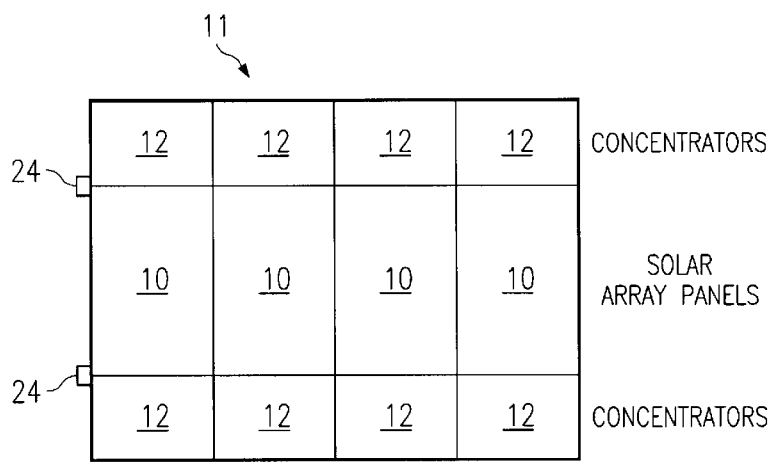
FIG. 1 illustrates a system having adjustable concentrators coupled to solar array panels, in accordance with an embodiment of the present invention.

FIG. 1 illustrates a system 11 for improving the power output from solar array panels in accordance with an embodiment of the present invention. Solar array panels 10 are coupled to concentrators 12. The solar array panels 10 comprise conventional solar cells responding to solar energy for converting incoming solar energy to electrical energy. Solar array panels 10 may be electrically coupled to an object, such as a spacecraft, to provide power at a certain voltage and current for the object. Concentrators 12 reflect solar energy to solar array panels 10. Such reflection provides more solar energy to solar array panels 10, thus improving the power output from solar array panels 10. The concentrators 12 are hinged to the solar array panels 10 and are adjustable by means of stepper drive motors 24 coupled to drive shafts forming hinge elements between the solar array panels 10 and the concentrators 12. Using adjustable concentrators 12 allows the concentrators to be moved and positioned to optimize that amount of solar energy reflected to solar array panels 10. Moreover, adjustable concentrators can decrease the shading of solar array panels that may occur by a fixed solar array panel/concentrator assembly.

Figure 2A:
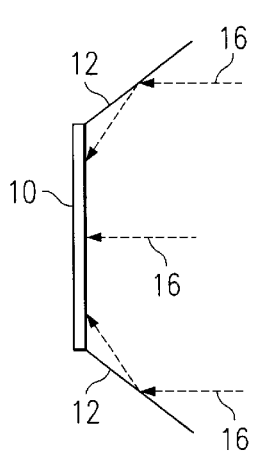
FIGS. 2A, 2B and 2C illustrate the adjustable concentrators of FIG. 1 in different positions relative to solar array panels, in accordance with an embodiment of the present invention.
Figure 2B:
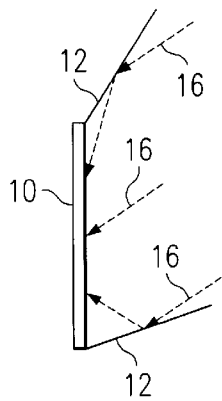
Figure 2C:
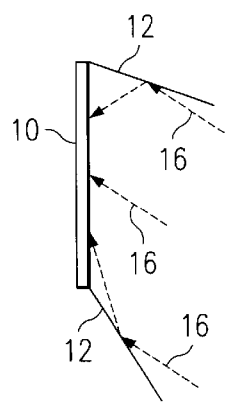

FIGS. 2A–2C are side views of system 11 of FIG. 1 wherein concentrators 12 are positioned at different angles to reflect solar energy 16 to solar array panels 10. As illustrated, the concentrators 12 may be adjusted relative to the position of the solar array panels 10, depending on the direction from which the solar energy 16 is received. Thus, the concentrators 12 may be adjusted based on the position of the solar array panels 10 relative to the sun.

Figure 3:
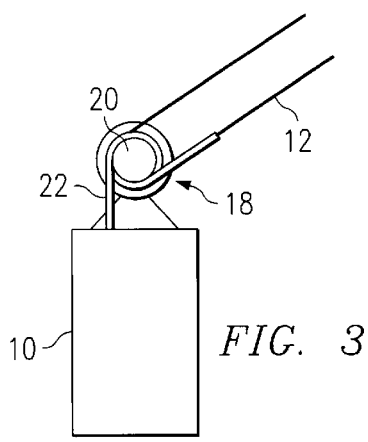
FIG. 3 illustrates a system comprising an adjustable concentrator coupled to a solar array panel, in accordance with an embodiment of the present invention.

FIG. 3 illustrates a system comprising a solar array panel 10 coupled to a concentrator 12 through a drive shaft assembly 18 with a drive shaft 20. As a motor (not shown) coupled to the drive shaft 20 turns the drive shaft, the angle between the concentrator 12 and the solar array panel 10 will be changed, thus allowing solar energy to be reflected onto solar array panel 10. The motor drives the drive shaft 20 against a spring 22.

Figure 4:
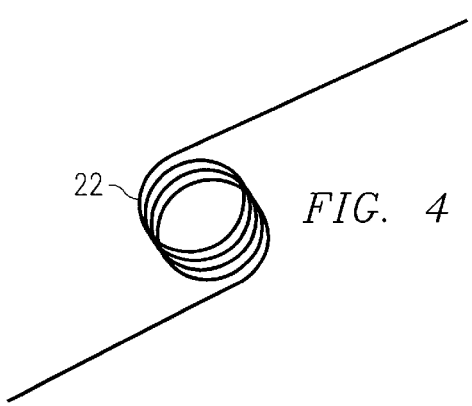
FIG. 4 illustrates a spring for the system of FIG. 3 that aids in the deployment of the concentrator coupled to the solar array panel, in accordance with an embodiment of the present invention.

FIG. 4 illustrates the spring 22 of FIG. 3 in a neutral, relaxed position. When spring 22 is in such neutral position, the concentrator 12 is at an angle of 180° relative to solar array panels 10, or in alignment with solar array panel 10. At such position, no solar energy will be reflected onto solar array panel 10, and concentrator 12 will not shadow solar array panel 10. Rotating the drive shaft 20 against the spring 22 tends to dampen out vibrations which may occur in the concentrator 12 during operation.

As the motor drives the drive shaft 20 past the 180° position described above, the drive force will be against the tension of the spring 22. Should the motor fail, the spring 22 will return to a neutral position such that the concentrator 12 is in alignment with the solar array panel 10. This neutral position assures that the solar array panel 10 is not covered or shaded preventing full power output from the solar array panel 10 in the event of an anomaly in the system.

Spring 22 may also be used to deploy the concentrator 12 from a stowed position in some applications, such as when the concentrator is coupled to a solar array panel 10 of a spacecraft as further discussed below. The concentrator 12 may be folded back behind the solar array panel 10 when in a stowed position, and upon deployment of the solar array panel 10, the spring 22 may deploy to a neutral position, thereby rotating the concentrator 12 to the 180° position discussed above.

Figure 5:
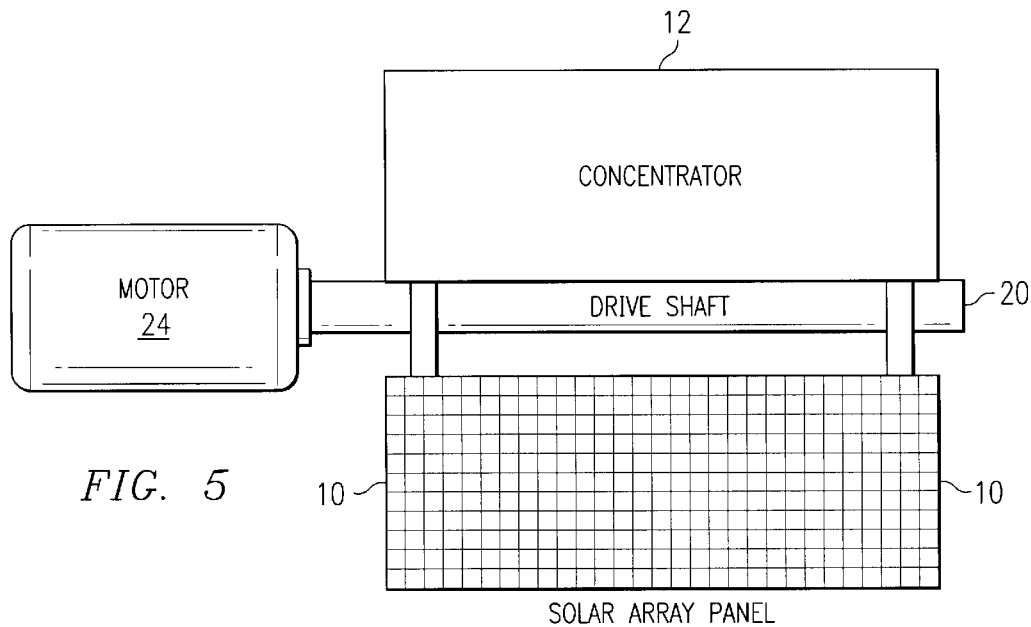
FIG. 5 illustrates a motor and drive shaft for the system of FIG. 3 for rotating the concentrator relative to the solar array panel, in accordance with an embodiment of the present invention.

FIG. 5 is a diagram illustrating a positioning motor 24 coupled to a drive shaft 20 that functions as a hinge thereby enabling rotation of concentrator 12 relative to solar array panel 10. As the positioning motor 24 rotates the shaft 20, the angle between the concentrator 12 and the solar array panel 10 is changed so that solar energy is reflected off of the concentrator 12 onto the solar array panel 10. The motor 24 may be controlled by an automatic control system. For example, a computer may determine the optimal position of the concentrator 12 relative to the solar array panel 10 based on the positions of the solar array panel 10 and the sun. The computer outputs instruction signals to control the motor 24 such that the motor 24 rotates the concentrator 12 to an optimal position determined by inputs to the computer. In particular embodiments in which the solar array panel 10 is coupled to a spacecraft, the computer may be onboard the spacecraft.

As stated above, in particular embodiments of the present invention, the concentrators and the solar array panels described herein are coupled to a spacecraft in order to provide power to the spacecraft generated from solar energy. In such cases, the navigational systems of the spacecraft may adjust the angles of the concentrators relative to the solar array panels based on the movement and direction of the spacecraft for optimizing receipt and reflection of solar energy onto the solar array panels. Similar systems are currently used for adjustment of solar array drives during flight.

As the spacecraft orbits the earth (or travels in some other orbit), the angle of the spacecraft to the sun continually changes. The onboard computer of the spacecraft reads the rate of change from the onboard gyros and generates the proper signals to the motor 24 that rotates the drive shaft 20. The motor 24 rotates the drive shaft 20 to move the concentrator 12 relative to the solar array panel 10, thus optimizing the amount of solar energy reflected onto the solar array panels.

While some embodiments described herein include a motor rotating a drive shaft in order to change the position of the concentrators relative to the solar array panels, it should be understood that other methods of changing the position of the concentrators may be used in other embodiments. Moreover, other embodiments may include methods other than a spring as described herein to provide deployment of the concentrators.

Figure 6:
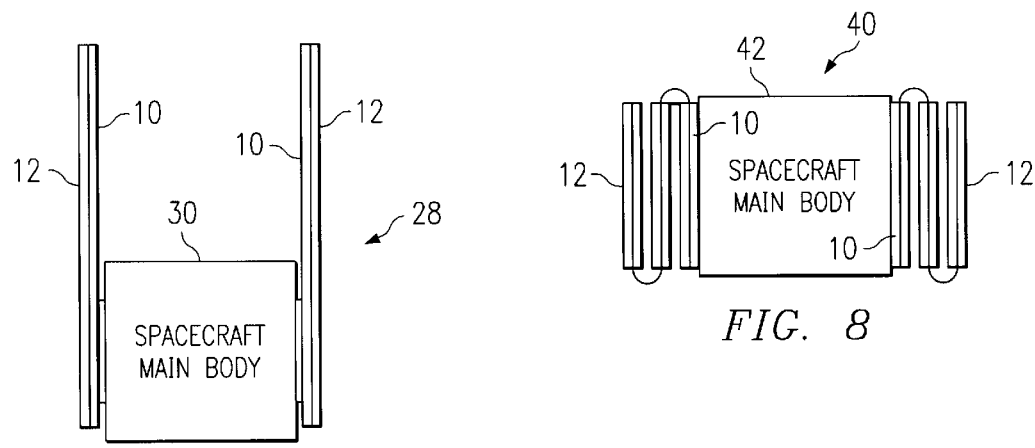
FIG. 6 illustrates solar array panels and adjustable concentrators coupled to the main body of a spacecraft, in accordance with an embodiment of the present invention.

FIG. 6 is a diagram illustrating a spacecraft 28 with a main body 30. Spacecraft 28 includes solar array panels 10 folded in a stowed, launch position. Concentrators 12 are folded behind solar array panels 12 in order to conserve space and to avoid shading of the solar array panels 10 if the concentrators 12 do not deploy correctly. As illustrated, the spacecraft 28 is placed on a booster, and a fairing or shroud placed over it for protection during launch. Once the spacecraft has been launched and reaches the desired altitude, the fairing is jettisoned. Subsequently during flight, the spacecraft 28 is separated from the booster, and the solar array panels may be deployed.

Figure 7:
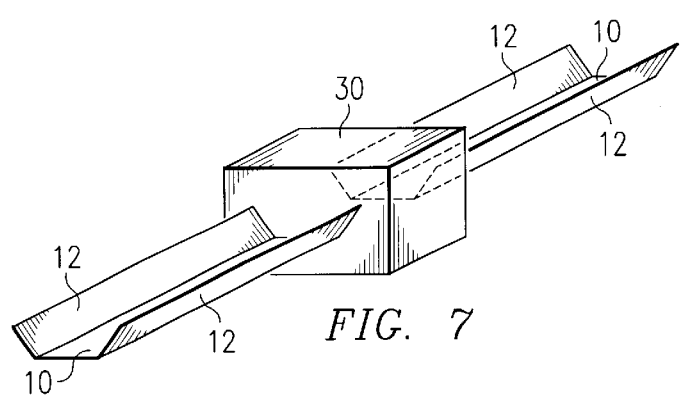
FIG. 7 illustrates the deployed adjustable concentrators and solar array panels coupled to the main body of a spacecraft, in accordance with an embodiment of the present invention.

FIG. 7 illustrates spacecraft 28 with solar array panels 10 in a deployed position. Concentrators 12 are also illustrated in a deployed position for reflection of solar energy onto solar array panels 10. The illustrated position of concentrators 12 in FIG. 7 is similar to the position of concentrators 12 illustrated in FIG. 2A. Once the solar array panels 10 have been deployed, a signal from the onboard computer of spacecraft 28 releases and deploys the concentrators 12. The motor 24 and springs 22 (illustrated and described above) will cause the drive shaft 20 to rotate and deploy the concentrators 12 to an operational position for reflecting solar energy to solar array panels 10. The concentrators 12 may be further adjusted based on the relative position of the solar array panels 10 and the sun.

Figure 8:
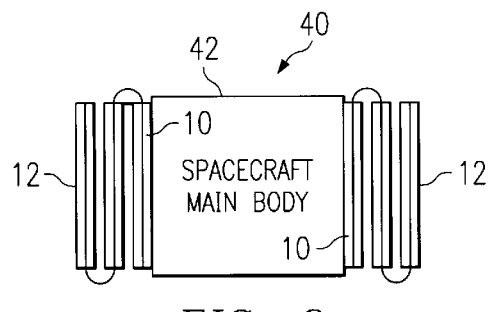
FIG. 8 illustrates the main body of a spacecraft with solar array panels and concentrators in a folded position, in accordance with an embodiment of the present invention.

FIG. 8 illustrates a spacecraft 40 with a main body 42 having solar array panels 10 folded in a stowed position for launch. By using a combination of hinges and springs, the solar array panels 10 may be folded thereby reducing the space needed on a booster for the spacecraft 40. Concentrators 12 may be coupled to the solar array panels 10 by a folding drive shaft that functions to rotate the concentrators as further described below.

Figure 9:
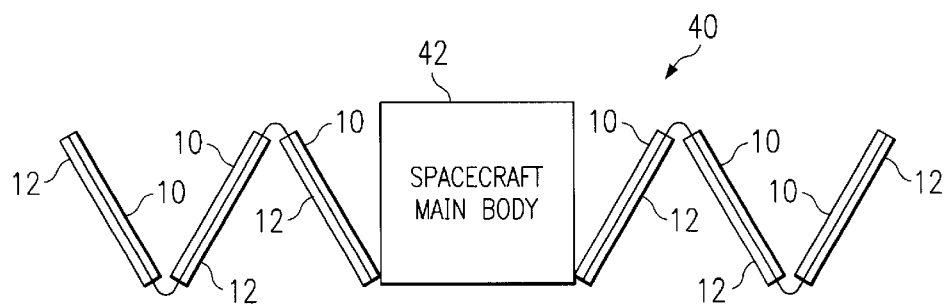
FIG. 9 illustrates the main body of a spacecraft with solar array panels and concentrators in a partially deployed position, in accordance with an embodiment of the present invention.

FIG. 9 illustrates spacecraft 40 showing a position of solar array panels 10 during deployment of the panels from their stowed position shown in FIG. 8. Once the solar array panels 10 are fully deployed (in a position approximately perpendicular to main body as sown in FIG. 7) and oriented towards the sun, the concentrators 12 may be deployed. Such deployment of the concentrators 12 may occur as a result of the rotational force exerted by the springs described above with respect to FIGS. 3 and 4 as they move to a neutral position. The motors 24 may then be activated to rotate the drive shaft 20 (see FIG. 5) that hinges the concentrators 12 relative to the solar array panels 10 so that the concentrators may be rotated to an optimal position for reflection of solar energy onto solar array panels.

Figure 10:
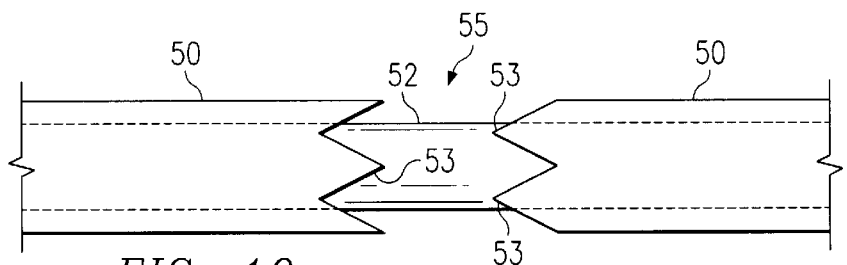
FIG. 10 illustrates a draw wire through hollow drive shaft segments of a drive shaft for rotating concentrators relative to solar array panels, in accordance with an embodiment of the present invention.

In order to fold the solar array panels 10 of FIG. 1 as described in the embodiment illustrated in FIGS. 8 and 9, the drive shaft 20 which hinges the concentrators 12 to the solar array panels 10 and rotates the concentrators 12 relative to the solar array panels 10 using the motor 24 (as illustrated in FIG. 5) may also be folded. The foldable drive shaft comprises hollow drive shaft segments with a draw wire running through the segments. FIG. 10 illustrates a hollow drive shaft 55 with splined segments 50 having a draw wire 52 running through the segments. The drive shaft segments 50 include splined ends 53 that engage a mating splined end of an adjacent segment 50 to form a continuous drive shaft that hinges the solar array panels 10 and the concentrators 12.

Figure 11A:
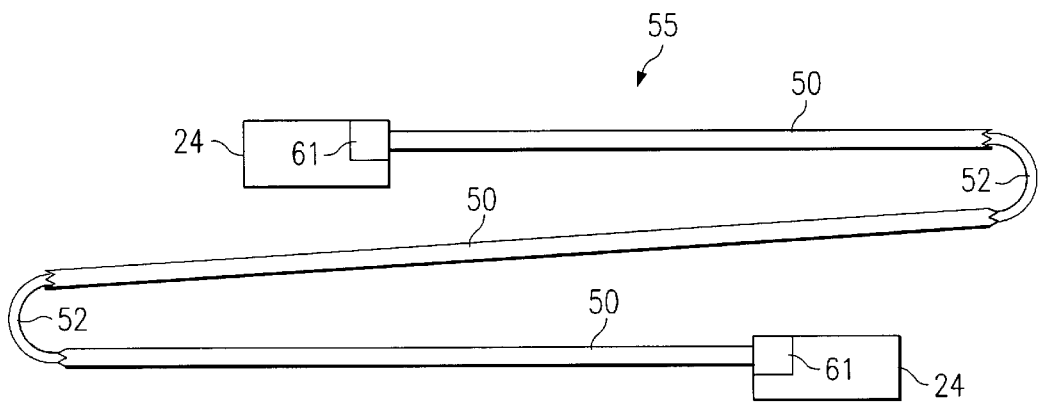
FIG. 11A illustrates the draw wire of FIG. 10 in a folded position, in accordance with an embodiment of the present invention.
Figure 11B:
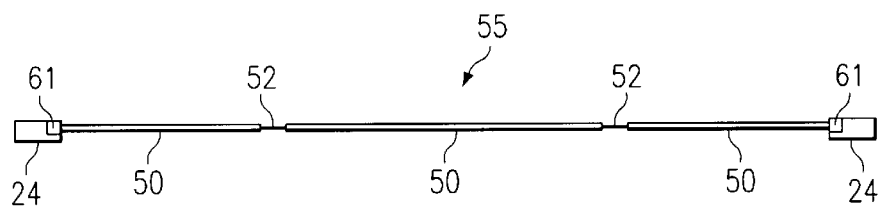
FIG. 11B illustrates the draw wire FIG. 10 in an unfolded position, in accordance with an embodiment of the present invention.

FIGS. 11A and 11B illustrate the operation of the drive shaft 55. FIG. 11A illustrates the drive shaft 55 in a folded position. The draw wire 52 is threaded through the hollow drive shaft segments 50, as illustrated in FIG. 10. Referring to FIG. 1, each drive shaft segment 50 hinges a concentrator 12 to a respective solar array panel 10. Draw wire 52 is visible between the hollow drive shaft segments 50. As illustrated, sufficient slack is provided in the draw wire 52 and some free play is provided between each of the drive shaft segments 50 to insure that the draw wire 52 is not tensioned until the solar array panels 10 begin to unfold.

Motors 24 are coupled to the ends of the drive shaft 55. Motors 24 include a wire draw mechanism 61 for tensioning the draw wire 52 to bring the drive shaft segments 50 together to form a unitary drive shaft 55.

FIG. 11B illustrates the drive shaft 55 after unfolding to form a rotary shaft. In operation, when the solar array panels 10 unfold (as illustrated in FIG. 9), the drive shaft segments engage an adjacent segment to form the drive shaft 55 thereby enabling the concentrators to be rotated into a desired position for reflection of solar energy. The drive shaft 55 is coupled to the solar array panels and the concentrators (as illustrated in FIG. 5 with respect to drive shaft 20, concentrators 12 and solar array panels 10). When the drive shaft 55, including the drive shaft segments 50 and draw wire 52, is unfolded, the wire draw mechanism 61 operates to pull the draw wire 52 tight from the ends so that the drive shaft segments 50 lock into place by engagement of adjacent splined end sections. Thus, drive shaft 55 becomes a rigid shaft that hingedly couples the solar array panels and the concentrators. Wire draw mechanism 61 includes a wire pull assembly for this function. Such wire pull assembly may occur by any of a number of mechanisms, such as by a wound spring assembly attached to a spool that, when released, provides a pulling motion to the draw wire 52.

Two motors 24 are illustrated (one on each end of the drive shaft 55) so that if one motor 24 fails, there is an additional motor to pull the draw wire 52 and rotate the concentrators. The motors 24 may be constructed with a solenoid assembly that couples the motors to the drive shaft 55. Thus, if there is a power or computer failure, the motors 24 would disengage from the drive shaft 55, and the concentrators would move to a fail-safe position so as not to shadow the solar array panels.

With the motors 24 disabled and the draw wire 52 holding the drive shaft segments 50 together into a continuous segment drive shaft, the spring 22, as illustrated in FIG. 3, rotates the drive shaft segments 50 to position the concentrators in alignment with the solar array panels. To position the concentrators into an optimal light-reflecting position based on the position of the sun relative to the solar array panels, the motor is activated to drive against the spring 22, as discussed above. As the drive shaft segments 50 are rotated, the angle between the concentrators and the solar array panels varies thereby enabling reflected light to be focused on the solar array panels. Examples of such angle variations are illustrated in FIGS. 2A, 2B and 2C. In particular embodiments, the range of motion of the concentrators may be approximately 150 degrees from a position of alignment, that is, in line with the solar array panels.

Particular embodiments of the present invention described above provide for rotation of concentrators that reflect solar energy onto solar array panels. The concentrators may be adjusted for optimum reflection of solar energy based on the position of the sun relative to the concentrators and the solar array panels. The solar array panels may be kept fixed while the concentrators may be adjusted. This is an advantageous alternative to driving the solar array panels relative to the concentrators, because costly and complicated drives for the solar array panels are avoided. Moreover, the mechanisms described herein for adjusting the concentrators are lighter than mechanisms for positioning the solar array panels, thus saving weight and adding maneuverability in applications where such mechanisms are used, such as spacecraft applications. Moreover, while particular embodiments described herein discuss the use of adjustable concentrators rotatably coupled to solar array panels for use in a spacecraft application, it should be understood that adjustable concentrators rotatably coupled to solar array panels may be used in other applications as well. For example, such adjustable concentrators may be used in various other applications where solar energy is received for conversion to power, such as in solar-powered automobiles.

Although the present invention has been described in detail, various changes and modifications may be suggested to one skilled in the art. It is intended that the present invention encompass such changes and modifications as falling within the scope of the appended claims.

What is claimed is:

1. A solar array concentrator assembly, comprising:
    a first solar array panel configured to receive solar energy
    a first adjustable concentrator coupled to the first solar array panel, the first adjustable concentrator reflecting solar energy toward the first solar array panel;
    a first drive shaft coupled to the first adjustable concentrator, the first drive shaft configured to rotate the first adjustable concentrator relative to the first solar array panel to maximize the solar energy reflected toward the first solar array panel; and
    a positioning motor coupled to the first drive shaft to adjust the position of the first concentrator relative to the first solar array panel to maximize the amount of solar energy reflected toward the first solar energy panel.

2. A solar array concentrator assembly, comprising:
    a first solar array panel configured to receive solar energy;
    a first adjustable concentrator coupled to the first solar array panel, the first adjustable concentrator reflecting solar energy toward the first solar array panel;
    a first drive shaft coupled to the first adjustable concentrator, the first drive shaft configured to rotate the first adjustable concentrator relative to the first solar array panel to maximize the solar energy reflected toward the first solar array panel;
    a second solar array panel foldably coupled to the first solar array panel;
    a second adjustable concentrator coupled to the second solar array panel, the second adjustable concentrator reflecting solar energy toward the second solar array panel;
    a second drive shaft coupled to the second adjustable concentrator, the second drive shaft configured to rotate the second adjustable concentrator relative to the second solar array panel to maximize the solar energy reflected toward the second solar array panel; and
    a draw mechanism coupled to the first and second drive shafts to engage the first drive shaft with the second drive shaft to form a continuous drive shaft and hinge between the first and second solar array panels.

3. The solar array concentrator assembly of claim 2, wherein:
    the first and second drive shafts comprise splined ends; and
    the draw mechanism comprises a draw wire that when tensioned causes the splines of one end of the first drive shaft to engage splines of one end of the second drive shaft to form the continuous drive shaft and hinge between the first and second solar array panels.

4. The roar array concentrator assembly of claim 3, wherein draw wire extends through the first and second drive shafts to pull the splines of the first and second drive shafts into engagement to form the continuous drive shaft and hinge between the first and second solar array panels.

5. The solar array concentrator assembly of claim 2, further comprising a positioning motor complied to the continuous drive shaft and hinge between the first and second solar array panels to adjust the position of the first and second concentrators relative to the first and second solar array panels to maximize the amount of solar energy reflected toward the first and second solar energy panels.

6. The solar array concentrator assembly of claim 2, further comprising a spacecraft body coupled to the first solar array panel.

7. A solar array concentrator assembly, comprising:
    a first solar array panel configured to receive solar energy;
    a first adjustable concentrator coupled to the first solar array panel, the first adjustable concentrator reflecting solar energy toward the first solar array panel;
    a first drive shaft segment coupled to the first adjustable concentrator, the first drive shaft segment configured to rotate the first adjustable concentrator relative to the first solar array panel to maximize the solar energy reflected toward the first solar array panel; and
    a positioning motor coupled to the first drive shaft segment to adjust the position of the first concentrator relative to the first solar array panel to maximize the amount of solar energy reflected toward the first solar energy panel.

8. A solar array concentrator assembly, comprising:
    a first solar array panel configured to receive solar energy;
    a first adjustable concentrator coupled to the first solar array panel, the first adjustable concentrator reflecting solar energy toward the first solar array panel;
    a first drive shaft segment coupled to the first adjustable concentrator, the first drive shaft segment configured to rotate the first adjustable concentrator relative to the first solar array panel to maximize the solar energy reflected toward the first solar array panel;
    a second solar array panel configured to receive solar energy, the second solar array panel foldably coupled to the first solar array panel;
    a second adjustable concentrator coupled to the second solar array panel, the second adjustable concentrator configured to reflect solar energy toward the second solar array panel;
    a second drive shaft segment coupled to the second adjustable concentrator, the second drive shaft segment configured to rotate the second adjustable concentrator relative to the second solar array panel to maximize the solar energy reflected toward the second solar array panel; and
    a draw mechanism coupled to the first and second drive shaft segments to engage the first drive shaft segment with the second drive shaft segment to form a continuous drive shaft and hinge between the first and second solar array panels.

9. The solar array concentrator assembly of claim 8, wherein:
    the first and second drive haft segments comprise splined ends; and
    the draw mechanism com rises a draw wire that when tensioned causes the splines of one end of the first drive shaft segment to engage splines of one end of the second drive shaft segment to form the continuous rive shaft and hinge between the first and second solar array panels.

10. The solar array concentrator assembly of claim 9, wherein the draw wire extends through the first and second drive shaft segments to pull the splines of the first and second drive shaft segments into engagement to form the continuous drive shaft and hinge between the first and second solar array panels.

11. The solar array concentrator assembly of claim 8, further comprising a positioning motor coupled to the continuous drive shaft and hinge to adjust the position of the first and second concentrators relative to the first and second solar array panels to maximize the amount of solar energy reflected toward the first and second solar energy panels.

12. A method for concentrating solar energy to a solar array panel, comprising:

receiving solar energy at a first adjustable concentrator;

reflecting the received solar energy to a first solar array panel;

rotatably coupling the first adjustable concentrator to the first solar array panel;

rotating the first adjustable concentrator relative to the first solar array panel to maximize the solar energy reflected toward the first solar array panel; and wherein rotating the first adjustable concentrator relative to the first solar array panel comprises actuating a positioning motor.

13. A method for concentrating solar energy to a solar array panel, comprising:

receiving solar energy at a first adjustable concentrator;

receiving solar energy at second adjustable concentrator;

reflecting the received solar energy to a second solar array panel;

rotatably coupling the second adjustable concentrator to the first solar array panel;

rotating the second adjustable concentrator relative to the second solar array panel to maximize the solar energy reflected toward the second solar array panel; and wherein rotatably coupling the first adjustable concentrator and rotatably coupling the second adjustable concentrator comprise engaging a first drive shaft segment with a second drive shaft segment by a dray mechanism coupled to the first and second drive shaft segments to form a continuous drive shaft and hinge between the first and second solar array panels.

14. The method of claim 13, wherein engaging the first drive shaft segment with the second drive shaft segment by a draw mechanism comprises engaging splines of one end of the first drive shaft segment to splines of one end of the second drive shaft segment by a draw wire to form the continuous drive shaft and hinge between the first and second solar array panels.

15. The method of claim 14, wherein engaging splines of one end of the first drive shaft segment to splines of one end of the second drive shaft segment by a draw wire comprises tensioning the draw wire to pull the splines of the first and second drive shaft segments into engagement.

16. The method of claim 13, wherein rotating the first adjustable concentrator relative to the first solar array panel and rotating the second adjustable concentrator relative to the second solar array panel comprise actuating a positioning motor.

* * * * *

UNITED STATES PATENT AND TRADEMARK OFFICE
CERTIFICATE OF CORRECTION

PATENT NO.    : 6,655,638 B2
DATED         : December 2, 2003
INVENTOR(S)   : Gary G. Deel It is certified that error appears in the above-identified patent and that said Letters Patent is hereby corrected as shown below:

Column 5,
Line 33, after "as" delete "sown" and insert -- shown --.

Column 7,
Line 14, after "energy" insert -- ; --.
Line 64, after "wherein" insert -- the --.

Column 8,
Line 2, after "motor" delete "compiled" and insert -- coupled --.
Line 60, after "mechanism" delete "com rises" and insert -- comprises --.
Line 63, after "continuous" delete "rive" and insert -- drive --.

Column 9,
Line 27, after concentrator:" insert --
    reflecting the received solar energy to a first solar array panel;
    rotatably coupling the first adjustable concentrator to the first solar array panel;
    rotating the first adjustable concentrator relative to the first solar array panel to
    maximize the solar energy reflected toward the first solar array panel; --.

Column 10,
Line 9, after "a" delete "dray" and insert -- draw --.

Signed and Sealed this

Sixth Day of July, 2004

JON W. DUDAS
*Acting Director of the United States Patent and Trademark Office*